United States Patent
Kobayashi

(10) Patent No.: US 8,098,363 B2
(45) Date of Patent: Jan. 17, 2012

(54) EXPOSURE APPARATUS AND METHOD OF MANUFACTURING A DEVICE

(75) Inventor: Takenobu Kobayashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 630 days.

(21) Appl. No.: 12/234,260

(22) Filed: Sep. 19, 2008

(65) Prior Publication Data

US 2009/0115888 A1 May 7, 2009

(30) Foreign Application Priority Data

Nov. 1, 2007 (JP) ................. 2007-285402

(51) Int. Cl.
*G03B 27/42* (2006.01)
(52) U.S. Cl. .......................... 355/53; 355/30
(58) Field of Classification Search .............. 355/30, 355/53
See application file for complete search history.

(56) References Cited

U.S. PATENT DOCUMENTS

| | | | |
|---|---|---|---|
| 6,674,510 B1 | 1/2004 | Jasper et al. | |
| 7,423,726 B2 | 9/2008 | Kosugi | |
| 2005/0169515 A1 | 8/2005 | Kobayashi et al. | 382/151 |
| 2008/0316450 A1 | 12/2008 | Kosugi | |

FOREIGN PATENT DOCUMENTS

| | | |
|---|---|---|
| JP | 3-082282 | 4/1991 |
| KR | 10-2000-0051488 A | 8/2000 |
| KR | 10-2000-0076779 A | 12/2000 |
| KR | 10-2007-099464 A | 10/2007 |

OTHER PUBLICATIONS

Korean Office Action dated Aug. 23, 2010, issued in counterpart Korean patent application No. 10-2008-0108240.

*Primary Examiner* — Edward Glick
*Assistant Examiner* — Mesfin T Asfaw
(74) *Attorney, Agent, or Firm* — Fitzpatrick, Cella, Harper & Scinto

(57) ABSTRACT

An exposure apparatus that exposes a shot region on a substrate to radiant energy based on an obtained position of a surface of the shot region. A projecting optical system obliquely projects detection light to a surface of a shot region on a substrate. A receiving optical system receives the detection light reflected at the shot region. A detector includes a photodetector that accumulates charges generated by the detection light incident thereon and detects a position of the detection light incident on the photodetector from the receiving optical system. A controller obtains a position of the surface based on the detection by the detector. The controller causes the projecting optical system to project the detection light, to cause the receiving optical system to cause the projected detection light to be incident on the detector, and to cause the photodetector to discharge the charges generated by light incident from the receiving optical system, during a time between an end of a detection of a first shot region by the detector and a start of a detection of a second shot region by the detector. The first shot region and the second shot region are successively measured by the detector.

4 Claims, 14 Drawing Sheets

F I G. 10A
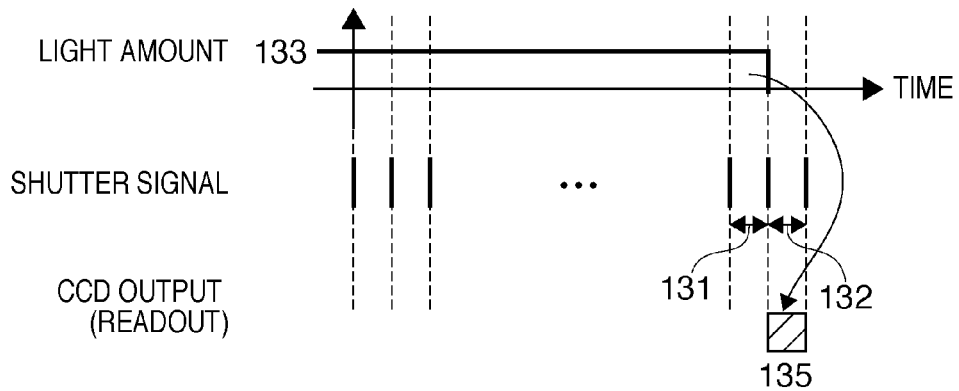
F I G. 10B
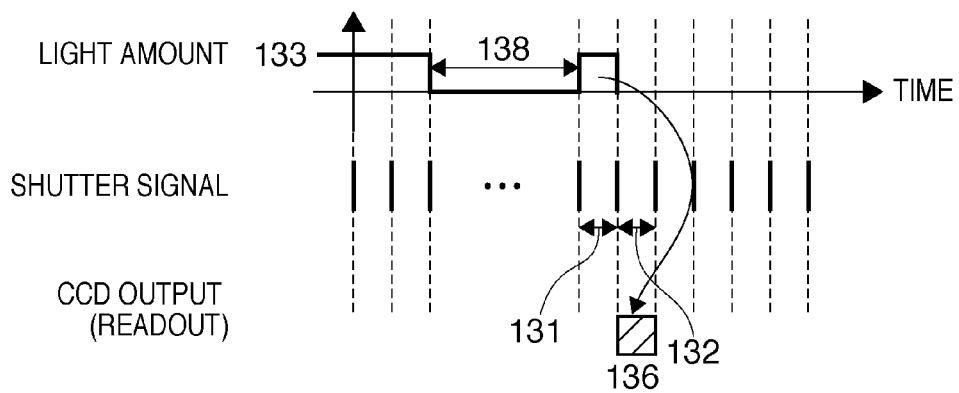
F I G. 10C
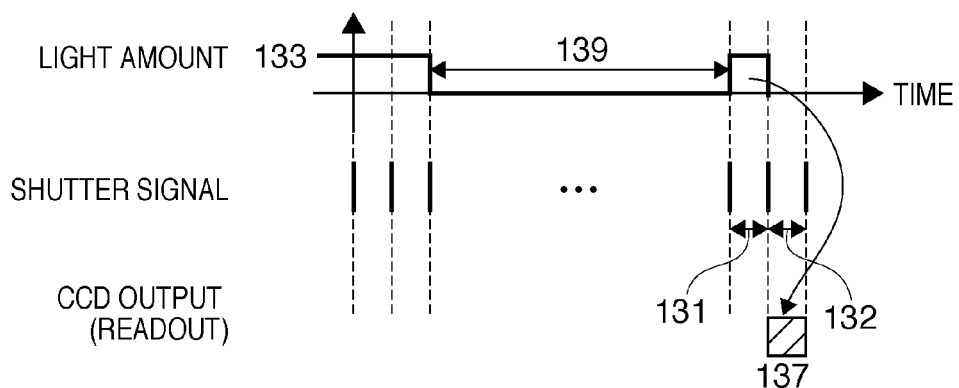

EXPOSURE APPARATUS AND METHOD OF MANUFACTURING A DEVICE

This application claims benefit of Japanese Patent Application No. 2007-285402, filed Nov. 1, 2007, which is hereby incorporated by reference herein in its entirety.

BACKGROUND OF THE INVENTION

1. Field of the Invention

The present invention relates to an exposure apparatus and a method of manufacturing a device.

2. Description of the Related Art

Currently, the miniaturization of circuit patterns is in progressing, along with an increase in the packing density of VLSIs. Along with this trend, the NA of a projection lens system used for a projection exposure apparatus is further increasing. To achieve this, the depth of focus that the projection lens system can tolerate in a process of transferring a circuit pattern is further decreasing. To attain satisfactory transfer of a circuit pattern, it is necessary to accurately set the entire exposure target region on the wafer to fall within the depth of focus that the projection lens system can provide.

In manufacturing, for example, a semiconductor element, a scanning type projection exposure apparatus, such as that of the step and scan scheme is used, in addition to a full-plate exposure type projection exposure apparatus, such as a stepper.

From the viewpoint of an improvement in processing efficiency, even an exposure apparatus that transfers a pattern, which is formed on an original, by exposure, using a plurality of wafer stages to improve the productivity, adopts the following scheme. That is, while a scan exposure operation is performed on one wafer stage, the surface position of the substrate is detected on the other wafer stage.

A case in which a CCD is used as a photodetector, in the scheme in which a light beam becomes obliquely incident on the wafer surface and the surface position is detected from the position of the light reflected by the wafer surface, will be exemplified below.

A charge accumulation type CCD shown in FIG. 1 accumulates a charge converted from light by a photodiode 101. A transfer gate 103 transfers the charge in the photodiode 101 to a vertical CCD 102. The vertical CCD 102 transfers the charge transferred from the photodiode 101 in the vertical direction stepwise. A horizontal CCD 104 transfers, in the horizontal direction, the charge transferred from the vertical CCD 102. An output amplifier 105 converts the charge into a voltage.

Japanese Patent Laid-Open No. 3-82282 describes a phenomenon in which a charge accumulation type CCD of this scheme cannot read out at one time the overall amount of charge accumulated in the photodiode 101, so a certain amount of charge remains in the photodiode 101, and appears as a residual image.

FIG. 2 shows diagrams for explaining the structure of a portion that transfers a charge from the photodiode 101 to the vertical CCD 102, and the generation of a residual image. Reference numeral 111 denotes a P layer; reference numeral 112, an N layer that forms a vertical CCD 102; and reference numeral 113, an N layer that forms a photodiode. Reference numeral 114 denotes a P layer for electrically isolating pixels. Reference numeral 115 denotes a light-shielding aluminum layer for shielding the vertical CCD 102 against light.

A charge 123 is accumulated in the photodiode, as shown in portion 2a of FIG. 2. When the potential of the vertical CCD is changed from a potential 121 to a lowest potential 122, as shown in portion 2b of FIG. 2, the transfer gate is enabled. In this state, a charge 125 is read out to the vertical CCD, and serves as a readout charge. A charge 124 remaining in the photodiode serves as an untransferred charge (remaining charge) involved in the generation of a residual image. Letting Qa be the accumulated charge 123, and Qb be the untransferred charge 124, the readout charge 125 is given by Qa-Qb.

When light is accumulated in the state shown in portion 2b of FIG. 2, an accumulated charge 123 is generated, as shown in portion 3a of FIG. 3. The accumulated charge 123 is then read out to the vertical CCD as a readout charge 123, as shown in portion 3b of FIG. 3, and the charge 124 remains as an untransferred charge again. In this manner, a stable output is obtained from the CCD, as long as a predetermined accumulation and readout are repeated by performing, for example, one readout for every accumulation.

A residual image charge generated has a correlation with an accumulated charge. For example, the residual image charge increases as the accumulated charge increases, and the residual image charge decreases as the accumulated charge decreases. For this reason, when readout is repeatedly performed in a light-shielding state or a dark state, the residual image charge 124 is read out without replenishing the accumulated charge. Then, the amount of residual image charge becomes smaller than that of the residual image charge 124. FIG. 4 shows this state. Portion 4a of FIG. 4 shows a state in which light is accumulated in a light-shielding state after the state shown in portion 2b of FIG. 2. Assume that the residual image charge 124 is stored in the photodiode 101 at this time. In the state shown in portion 4a of FIG. 4, a readout charge 127 of the residual image charge 124 is then read out to the vertical CCD, as shown in portion 4b of FIG. 4, and a charge 126 remains as a residual image charge. Letting Qc be the readout charge 127, the residual image charge 126 is given by Qb-Qc. In this manner, every time the operation shown in portions 4a and 4b of FIG. 4 is repeatedly performed, the residual image charge amount decreases.

Such a phenomenon occurs in a dark state. Even when light is received by the CCD in an amount equal to that in a state other than a dark state, the accumulated charge 123 changes depending on the residual image charge amount immediately before the light reception, and the readout charge changes accordingly. In addition, the readout efficiency of the readout charge amount with respect to the accumulated charge amount changes for each pixel of the CCD. Under this influence, the output result from the CCD varies for each pixel.

To reduce such a variation in the output result from the CCD, Japanese Patent Laid-Open No. 3-82282 discloses a method of repeating operations 1 to 3:

1. The residual image charge is discharged by readout in a light-shielding state.
2. An illumination unit is turned on and then the charge is discharged.
3. All the signal charges are read out while allowing a certain amount of charge to remain in a light-receiving element by accumulating target light.

The method disclosed in Japanese Patent Laid-Open No. 3-82282 provides an illumination unit for irradiating the CCD with light, in addition to a light source for guiding a light beam to become incident on the wafer surface.

Although a case in which a CCD is used has been exemplified herein, a variation in output result inevitably occurs, irrespective of the type of photoelectric element used, as long as the efficiency of readout from it is not 100%. Also, although a phenomenon in which the untransferred charge amount changes due to readout in a dark state has been exemplified herein, it changes due to the presence of the time for which the CCD is in a dark state, because the untransferred charge discharges spontaneously. Therefore, a change in untransferred charge to be solved by the present invention includes such a change in untransferred charge due to its spontaneous discharge.

FIG. 8 shows a simple operation timing when a one-dimensional CCD sensor (to be merely referred to as a CCD hereafter) is used as a photodetector 13, serving as a position detection element. When detection light in an amount 133 is emitted by a light source 6, and received by the CCD during a CCD electronic shutter interval 131, a CCD output signal 134 is read out in the next electronic shutter interval 132. The amount 133 of detection light emitted by the light source 6 is virtually the same as the amount of detection light received by the CCD. The amount of light received in an electronic shutter interval before the electronic shutter interval 131 is read out in the electronic shutter interval 131 again, but a description thereof will not be given herein. A case in which a pixel corresponding to a certain light component that has passed through one pinhole in a mask 8 and has been received on the CCD is extracted, will be considered. In this case, the CCD output signal 134 for the CCD pixel position is as shown in FIG. 9. The position of the substrate surface is calculated from the feature values of the signal waveform shown in FIG. 9. Although the feature values of the waveform include the barycentric position and maximum position of the waveform, the barycentric position will be exemplified hereafter.

FIG. 10A, FIG. 10B and FIG. 10C show three examples of the timing at which light in the amount 133 is supplied from the light source 6 to the CCD, and the way the light is received by the CCD during the electronic shutter interval 131, and the CCD output signal is read out in the electronic shutter interval 132. FIG. 11 shows the CCD output signals for the respective CCD pixel positions, which are read out in these examples. Assume that the same position on a wafer 4 is irradiated by the light source 6, and the light reflected by the wafer 4 is received by the CCD. The CCD outputs signals even in shutter intervals other than shutter interval 132, but a description thereof will not be given herein.

A CCD output signal 135 shown in FIG. 10A is obtained when light in the amount 133 is continuously supplied to the CCD at an arbitrary interval, until immediately before the electronic shutter interval 131, and the amount of light received in the electronic shutter interval 131 is read out in the electronic shutter interval 132.

A CCD output signal 136 shown in FIG. 10B is obtained when the amount 133 of light received in the electronic shutter interval 131, after a state in which the light source 6 has been unlighted (dark state) for a time 138, is read out in the electronic shutter interval 132.

A CCD output signal 137 shown in FIG. 10C is obtained when the amount 133 of light received in the electronic shutter interval 131, after a state in which the light source 6 has been unlighted (dark state) for a time 139, is read out in the electronic shutter interval 132.

The CCD output signals for the respective CCD pixel positions in these cases are indicated by 135, 136, and 137 in 11a of FIG. 11. Letting T1 and T2 be the unlighted times (dark times) 138 and 139, respectively, T1<T2.

Portion 11b of FIG. 11 shows the differences of the CCD output signals 136 and 137 from the CCD output signal 135 for the respective CCD pixel positions, which are read out by the method shown in FIG. 10A. Letting Qd, Qe, and Qf be the CCD output signals 135, 136, and 137, respectively, differences 143 and 144 are Qd-Qe, and Qd-Qf, respectively.

The barycentric positions of the CCD output signals 135, 136, and 137 are as indicated by 140, 141, and 142, respectively. This amounts to detecting the wafer surface position as being shifted. The reason why the surface position is detected as being shifted is that the differences 143 and 144 have asymmetrical shapes and, therefore, their barycenters shift. This phenomenon is encountered because an untransferred charge is generated due to the presence of the period for which the CCD is in a dark state, and the efficiency of the charge remaining untransferred differs for each pixel. Since the untransferred charge amount due to the presence of the unlighted time, and the efficiency of the charge remaining untransferred for each pixel are constant for each CCD, the barycentric position change amount with respect to the unlighted time changes with a certain correlation, as shown in FIG. 12.

The influence of the shift in the barycentric position of the output signal and, hence, in the surface position on a semiconductor exposure apparatus will be explained next.

FIG. 6 is an enlarged view of shots 151 and 152 on the wafer shown in FIG. 5, in a semiconductor exposure apparatus. The arrow indicates the detection order on the wafer. In other words, FIG. 6 shows a state in which a shot to detect the surface position is switched from the shot 151 to shot 152.

During switching from a last surface position detection position 161 of the shot 151 to a first surface position detection position 1621 of the shot 152, the CCD is not irradiated with light, even when the light source 6 is turned on, because no reflecting surface is present. For this reason, the untransferred charge is discharged, as shown in FIG. 4. This makes only the CCD output result obtained at the surface position detection position 1621 small. Portion 17a of FIG. 17 shows the relationship between the detection values at the surface position detection position 1621 to a surface position detection position 1625 of the shot 152.

Conversely, surface position detection values, as shown in 17b of FIG. 17 are obtained when the surface positions are detected by always scanning a certain shot in the periphery of the wafer outwards (in the order of the surface position detection positions 1625 to 1621) on the wafer without detecting the surface positions, inwards in this shot, on the wafer.

As shown in FIG. 17, the surface position detection value often suffers from an error depending on the state of the CCD immediately before the surface position detection, as indicated by the surface position detection position 1621 shown in portion 17a of FIG. 17. On the other hand, it is necessary for the method shown in portion 17b of FIG. 17 to scan a shot such as that 151 outwards on the wafer, and then, return inwards on the wafer to scan the shot 152 outwards on the wafer, resulting in a decrease in productivity.

In order not to generate a dark state of the CCD, even during the switching from the surface position detection position 161 to that 1621, there has been proposed a method of projecting light from a secondary source onto the CCD, so as not to form a dark state, thereby suppressing a variation in sensitivity (Japanese Patent Laid-Open No. 3-82282). However, it is practically difficult to provide a secondary source and an optical system for forming it from the viewpoint of assuring its accommodation space and suppressing an increase in cost.

SUMMARY OF THE INVENTION

It is an exemplary object of the present invention to provide an exposure apparatus that can detect a position of a surface of a substrate with high accuracy.

According to a first aspect, the present invention provides an exposure apparatus that comprises a detector configured to obliquely project detection light to a surface of a substrate, and to detect a position of the detection light reflected at the substrate, and a controller configured to calculate a position of the surface based on the detection by the detector, and exposes the substrate to radiant energy based on the calculated position of the surface, wherein the controller is configured to correct, to obtain the calculated position of the surface, a position of the surface calculated based on the detection by the detector, in accordance with a period before the detection, during the period the detector is in a dark state, in which the detection light is not incident on the detector.

According to the second aspect, the present invention provids an exposure apparatus that comprises a projecting optical system configured to obliquely project detection light to a surface of a shot region on a substrate, a receiving optical system configured to receive the detection light reflected at the shot region, a detector configured to detect a position of the detection light from the receiving optical system, and a controller configured to calculate a position of the surface based on the detection by the detector, and exposes the substrate to radiant energy based on the calculated position of the surface, wherein the controller is configured, during a time between a first detection for a first shot belonging to a first column and a second detection for a second shot belonging to a second column, the first detection and the second detection being performed successively, to cause the projecting optical system to project the detection light, and to cause the receiving optical system to make the detection light be incident on the detector.

According to the present invention, it is possible to provide, for example, an exposure apparatus that can detect a position of a surface of a substrate with high accuracy.

Further features of the present invention will become apparent from the following description of exemplary embodiments with reference to the attached drawings.

BRIEF DESCRIPTION OF THE DRAWINGS

FIG. 10A shows explanatory charts of a method of supplying light to the CCD, and the output timing;

FIG. 10B shows explanatory charts of a method of supplying light to the CCD, and the output timing;

FIG. 10C shows explanatory charts of a method of supplying light to the CCD, and the output timing;

DESCRIPTION OF THE EMBODIMENTS

Embodiments according to the present invention will be described below with reference to the accompanying drawings.

First Embodiment

Figure 7:
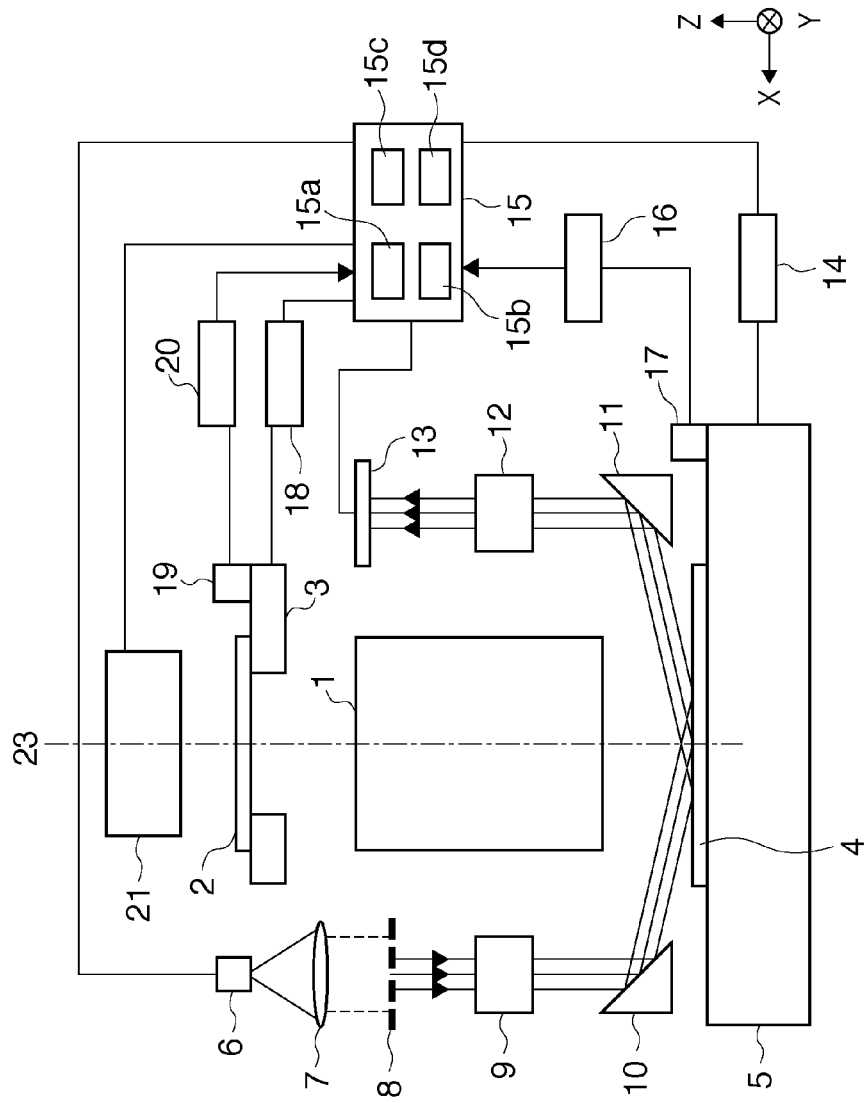
FIG. 7 is a block diagram showing the schematic arrangement of an exposure apparatus.
Figure 8:
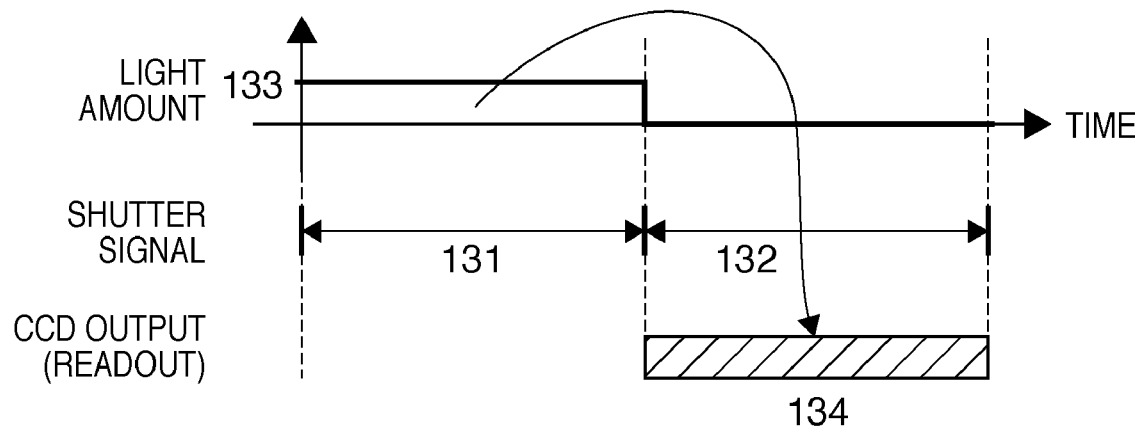
FIG. 8 is an explanatory chart of the operation of the CCD.
Figure 9:
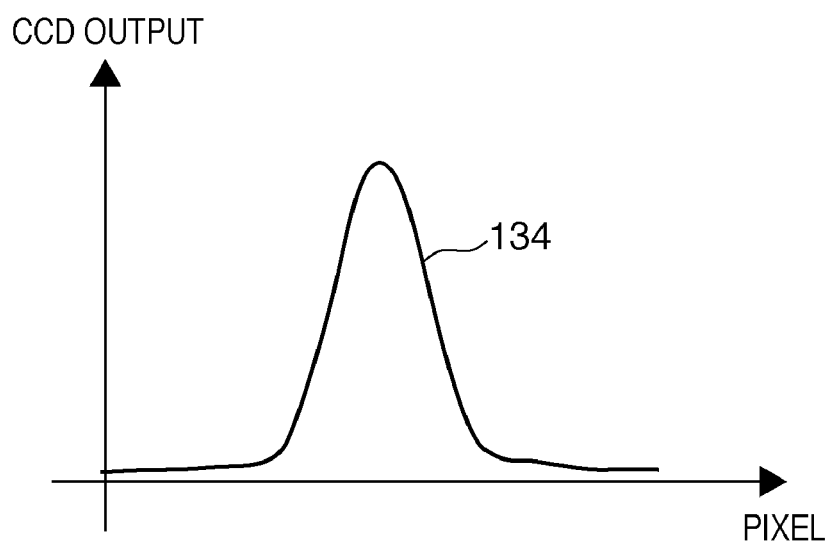
FIG. 9 is an explanatory graph of a CCD output signal.

FIG. 7 is a schematic block diagram of a portion of a reduction projection exposure apparatus having an oblique-incidence surface position detector that detects the surface position of a substrate, according to the present invention. The surface position of a substrate includes the surface position and tilt of the substrate. A projection optical system 1 having an optical axis 23 reduces the circuit pattern of an original (reticle) 2, for example, to ¼ and projects it to the focal plane of the projection optical system 1, thereby forming a circuit pattern image on the focal plane. The optical axis 23 is parallel to the Z-axis direction in FIG. 7.

A reticle stage 3 holds the original (reticle) 2, and can horizontally move in the Y-axis direction and rotate about an axis parallel to the Z-axis direction. In a shot region formed on a wafer 4 as a substrate coated with a resist on its surface, a large number of shots, in which the same pattern is formed by a preceding exposure process, are arrayed. The wafer 4 mounted on a wafer stage 5 is chucked and fixed by the wafer stage 5. The wafer stage 5 includes an X-Y stage that can horizontally move in the X- and Y-axis directions, a leveling stage that moves in the Z-axis direction and rotates about axes parallel to the X- and Y-axis directions, and a rotary stage that rotates about an axis parallel to the Z-axis direction. The X-, Y-, and Z-axes are set to be orthogonal to each other.

By driving the wafer stage 5, the surface position of the wafer 4 is adjusted in the direction of the optical axis 23 of the projection optical system 1, and in a direction along a plane perpendicular to the optical axis 23, and the tilt of the wafer 4 with respect to the focal plane, that is, the circuit pattern image is also adjusted.

The movement of the reticle stage 3 is controlled by a reticle stage driving unit 18, while that of the wafer stage 5 is controlled by a wafer stage driving unit 14. The reticle stage driving unit 18 can adjust the position (y) and rotation (θ) of the reticle 2 on a plane perpendicular to the optical axis 23. The wafer stage driving unit 14 can adjust the position (x, y) and rotation (θ) of the wafer 4 on a plane perpendicular to the optical axis 23, and can adjust the position (z) and tilts (α, β) of the wafer 4 in the direction of the optical axis 23. The reticle stage driving unit 18 and the wafer stage driving unit 14 perform servo driving of the reticle stage 3 and wafer stage 5, respectively, in response to command signals received from a controller 15 via signal lines.

In addition to controlling the reticle stage driving unit 18 and wafer stage driving unit 14, the controller 15 includes a control unit 15a that sends independent command signals to a light source 6, photodetector 13, and exposure light source 21 (to be described later) via signal lines, thereby controlling them. The controller 15 also includes a processor 15b, a correction unit 15c, and storage unit 15d (to be described later).

Reference numerals 6 to 13 in FIG. 7 denote elements of a surface position detector, including an oblique-incidence optical system provided to detect the surface position of the wafer 4. The illumination light source 6 is a high-luminance light source, such as a semiconductor laser. Light emitted by the illumination light source 6 is collimated into a parallel light beam by an illumination lens 7, and illuminates an opening mask (to be merely referred to as a "mask" hereafter) 8, in which a plurality of pinholes are formed. A plurality of spot-light beams having passed through the pinholes in the mask 8 become incident on a mirror 10 via an imaging lens 9. After being deflected by the mirror 10, these spot light beams become obliquely incident on the surface of the wafer 4. The plurality of spot light beams via the mask 8 illuminate a plurality of portions, including the central portion of the exposure target region on the wafer 4 (above the optical axis of the projection optical system 1).

In this embodiment, the plurality of pinholes in the mask 8 are formed at a plurality of portions in the exposure region on the wafer 4. The imaging lens 9 and mirror 10 form images of the plurality of pinholes in the mask 8 on the wafer 4. The light beams having passed through the plurality of pinholes in the mask 8 obliquely irradiate the plurality of portions, including the central portion of the exposure region on the wafer 4, and are obliquely reflected at these portions. That is, in this embodiment, a plurality of pinholes are formed in the mask 8, and surface position information is detected at the plurality of portions, including the central portion of the exposure target region.

The light beams obliquely reflected at the detection points on the wafer 4 are deflected by a mirror 11, and then, become incident on the photodetector 13, serving as the surface position detection element, via a detection lens 12. The detection lens 12 forms images of the pinholes in the mask 8 on the photodetector 13, in cooperation with the imaging lens 9, mirror 10, wafer 4, and mirror 11. That is, the mask 8 and the photodetector 13 are optically conjugate to each other. If such an optical configuration is hard to attain, a plurality of photodetectors 13 may be separately set in correspondence with the respective pinholes.

Although a plurality of pinholes are formed in the mask 8, in this embodiment, one pinhole may be formed.

The photodetector 13 is formed from, for example, a one-dimensional sensor or two-dimensional sensor (a position detection element, such as a CCD). The photodetector 13 can independently detect the positions at which the plurality of light beams, via the plurality of pinholes, become incident on the light-receiving surface of the photodetector 13.

A change in the position of the wafer 4 in the direction of the optical axis 23 of the projection optical system 1 can be detected as shifts in the positions at which the plurality of light beams become incident on the photodetector 13. In other words, the position of the wafer surface in the direction of the optical axis 23 at each of the plurality of points in the exposure target region on the wafer 4 can be detected, based on the signal output from the photodetector 13. This output signal is first surface position information output from the photodetector 13, which serves as the basis for surface position information used for wafer alignment. The signal output from the photodetector 13, as the first surface position information, is input to the processor 15b in the controller 15, and processed into the feature values of a signal waveform by the processor 15b. The feature values of a signal waveform can be, for example, the barycentric position and maximum position of the waveform.

A displacement of the wafer stage 5 in the X- and Y-axis directions is measured by a reference mirror 17 and laser interferometer 16 mounted on the wafer stage 5. A signal representing the displacement amount of the wafer stage 5 is input to the controller 15 via a signal line from the laser interferometer 16. The movement of the wafer stage 5 is controlled by the wafer stage driving unit 14, and the wafer stage driving unit 14, and the wafer stage driving unit 14 performs servo driving of the wafer stage 5, in response to a command signal received from the control unit 15a, via the signal line.

In this embodiment, the elements 6 to 10 constitute a projecting optical system for projecting detection light to the detection region, and the elements 11 to 13 constitute a receiving optical system for receiving the detection light.

The control unit 15a starts light beam emission by operating the illumination light source 6 from the displacement amount of the wafer stage 5 in the X- and Y-axis directions during the movement of the wafer stage 5. The processor 15b detects the surface position of the wafer 4 by processing the signal output from the photodetector 13, so that the exposure target region on the wafer 4 is moved to a target position, at which the wafer 4 is aligned with the reticle pattern, immediately beneath the optical axis 23 of the projection optical system 1.

A method of correcting a variation in surface position detected immediately after a dark state, according to this embodiment, will be explained next. In the present invention, a "dark state" means a state in which the detection light does not become incident on the photodetector, serving as the surface position detection element.

Figure 12:
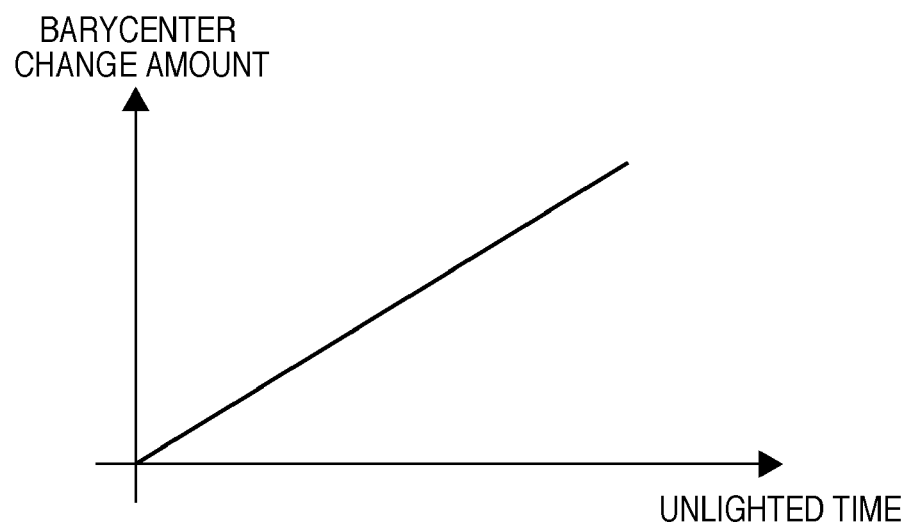
FIG. 12 is an explanatory graph of the relationship between the untransferred charge of the CCD and the amount of barycenter change.

First, the barycentric position (surface position) change amount with respect to the unlighted time, or the number of times of charge readout in a dark state, is stored in the storage unit 15d in the controller 15 as a correction table for each CCD, serving as the photodetector in advance, as shown in FIG. 12.

Figure 11:
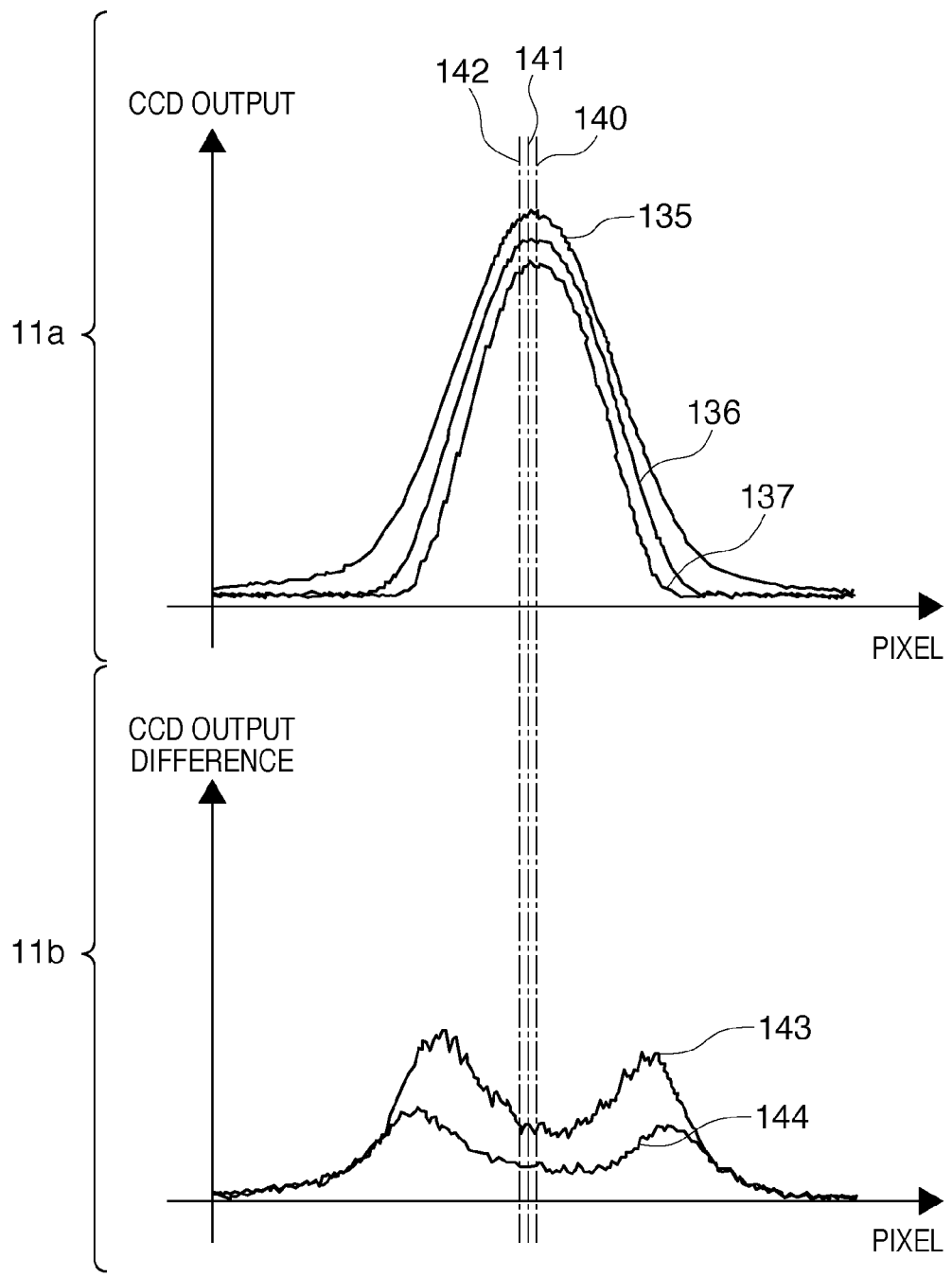
FIG. 11 shows explanatory graphs, each of a signal output from the CCD shown in FIG. 1.

An example of a method of generating a correction table shown in FIG. 12 will be explained, with reference to the flowchart shown in FIG. 16. In response to a start command received in step S201, the control unit 15a issues a command to move the wafer stage 5 to a position at which surface position detection is possible, in step S202. The position at which surface position detection is possible need only be a position, at which the photodetector 13 can receive light from the illumination light source 6, such as the surface of the wafer 4, or a reference plane surface (reference reflecting surface) (not shown) to calibrate the surface position on the wafer stage 5. In step S203, the control unit 15a turns on the illumination light source 6 and keeps it lighted for the period, during which the output from the CCD, serving as the position detection element, is the CCD output signal 135 shown in portion 11a of FIG. 11, or more. In other words, the residual image charge is set to the state indicated by reference numeral 124 in portion 3b of FIG. 3.

In step S204, the controller 15 turns off the illumination light source 6 and keeps it unlighted for an arbitrary time. In step S205, the control unit 15a turns on the illumination light source 6. In step S206, the control unit 15a reads out the amount of light obtained in step S205 as a CCD output signal, calculates the barycentric position change amount, stores the calculated barycentric position change amount in the storage unit 15d, and then, turns off the illumination light source 6.

The control unit 15a repeats the operation from steps S203 to S206 in a number of times corresponding to an arbitrary necessary sample number, while changing the period for which the illumination light source 6 has been unlighted, in step S204. In step S206, the process may continuously shift to step S203 or S204 without turning off the illumination light source 6.

In step S207, the control unit 15a checks whether a barycentric position change amount corresponding to the necessary sample number is stored in the storage unit 15d. In step S208, the process ends.

Figure 16:
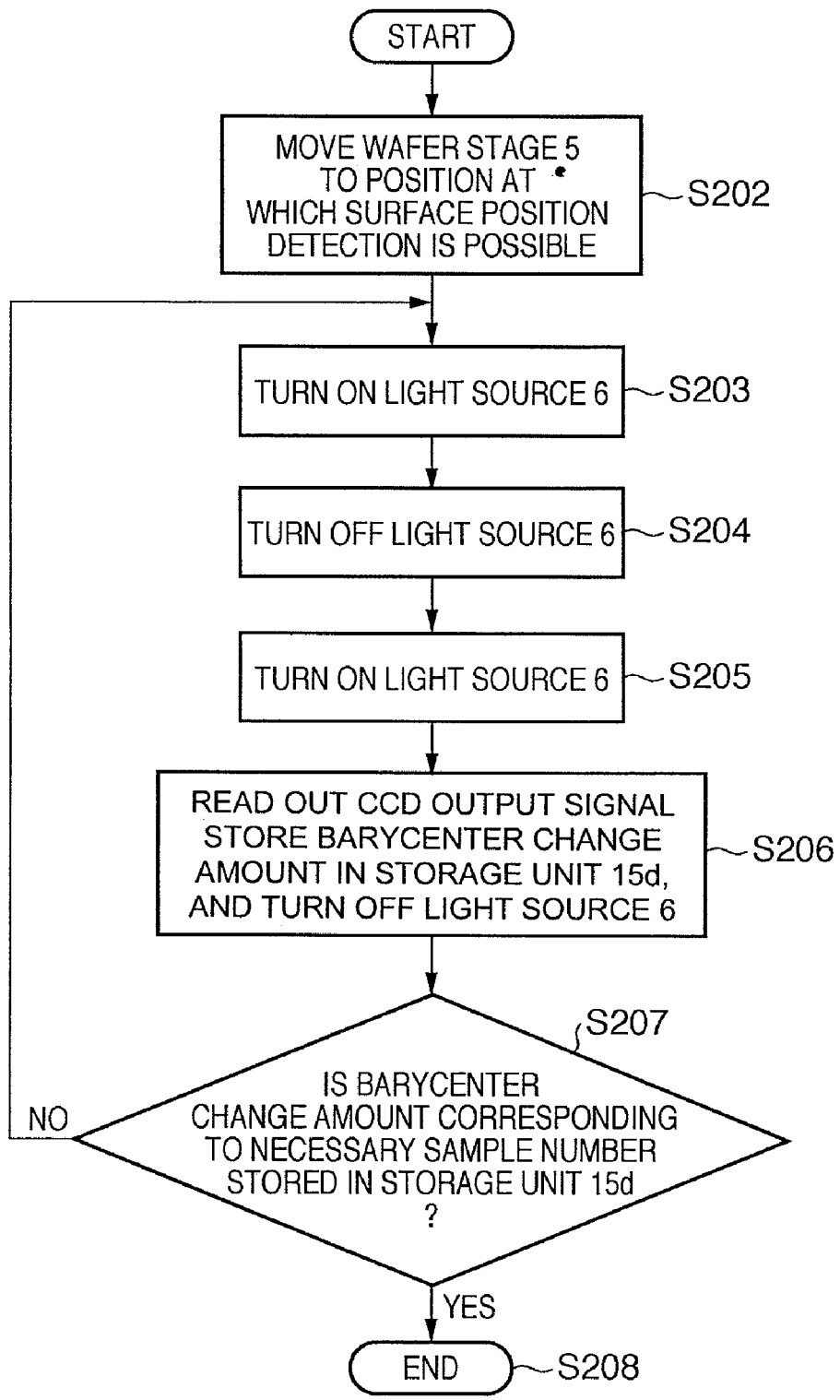
FIG. 16 is a flowchart illustrating how to acquire a correction table.

The correction table acquisition method shown in FIG. 12 is not particularly limited to that in the flowchart shown in FIG. 16, and a correction table may be acquired before apparatus assembly.

When the wafer stage 5 moves from a shot 153 on the inner side of the wafer to a shot 154, the illumination light source 6 is turned off. This movement time is the period during which the CCD is in a dark state. The correction unit 15c measures the period during which the CCD is in a dark state. Based on when the measured period, during which the CCD is in a dark state, and the correction table stored in the storage unit 15d, the correction unit 15c corrects the barycentric position processed by the processor 15b, and provides the corrected surface position information. As the period during which the CCD is in a dark state, not the movement time between successive shots, but the number of times of charge readout during this period, that is, the number of times of readout of the output from the photodetector, can be used. The barycentric position, corrected by the correction unit 15c, constitutes second surface position information used for substrate alignment intact.

Figure 6:
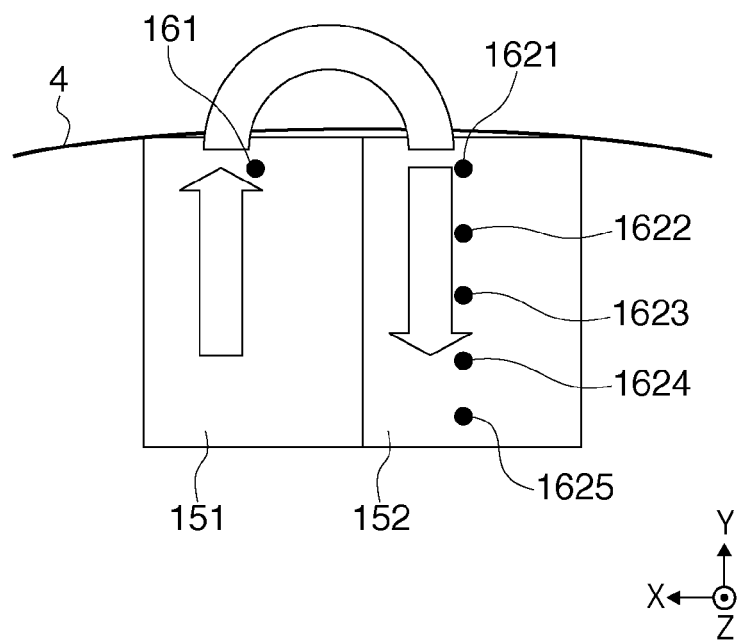
FIG. 6 is a partially enlarged diagram of the wafer shown in FIG. 5.
Figure 17:
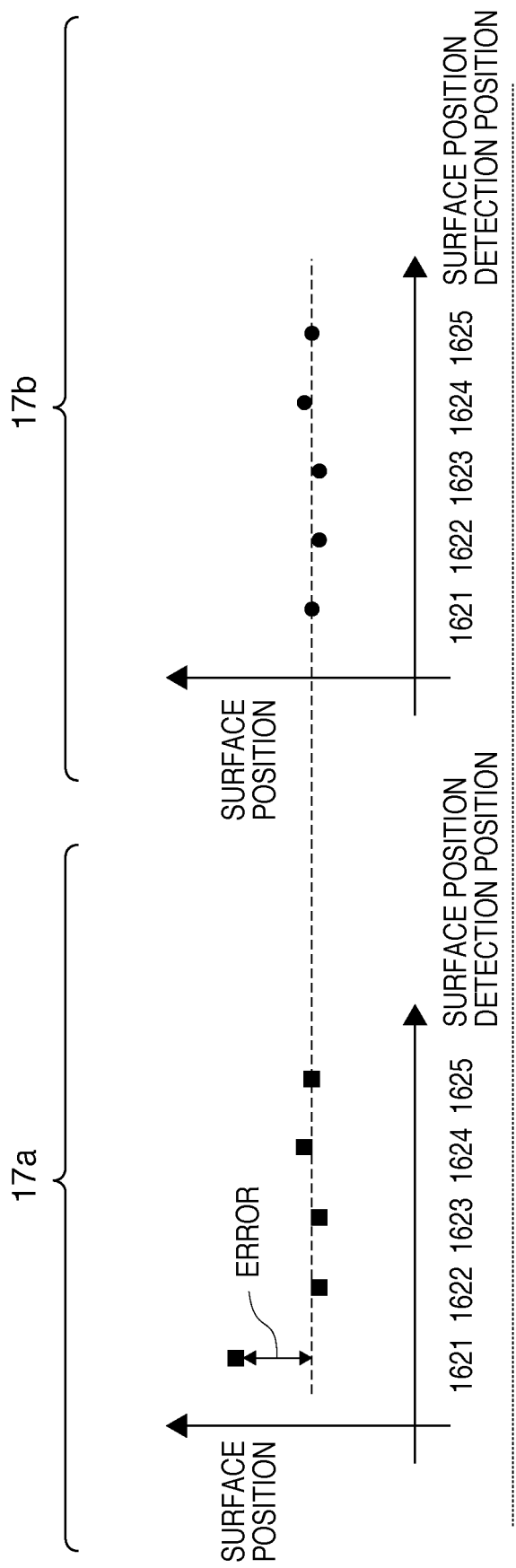
FIG. 17 shows charts for explaining the influence of the correction table in surface position detection.

Also, as shown in FIG. 6, when the wafer stage 5 moves from a surface position detection point 161 of a shot 151 to surface position detection point 1621 of a shot 152, the CCD is in a dark state, in which the detection light is not applied to it. Even in this case, assuming the stage movement time as the period during which the CCD is in a dark state, the barycentric position (surface position), at the surface position detection position 1621, is corrected by the correction unit 15c, based on the correction table. This makes it possible to correct a surface position deviated as shown in portion 17a of FIG. 17, into a surface position as shown in position 17b of FIG. 17.

Although not shown in FIG. 7, in order to detect pieces of level information, such as the surface position and tilt of the reticle 2, when a surface position detector, including an oblique-incidence optical system having elements as those denoted by reference numerals 6 to 13, is located on the side of the lower surface of the reticle, the same problem is posed again. Even in this case, the detection result of the surface position at the edge of the reticle suffers an error attributed to a dark state, which can be corrected by saving the relationship between the error and the time during which the CCD is in a dark state, or the number of times of readout.

Second Embodiment

Figure 5:
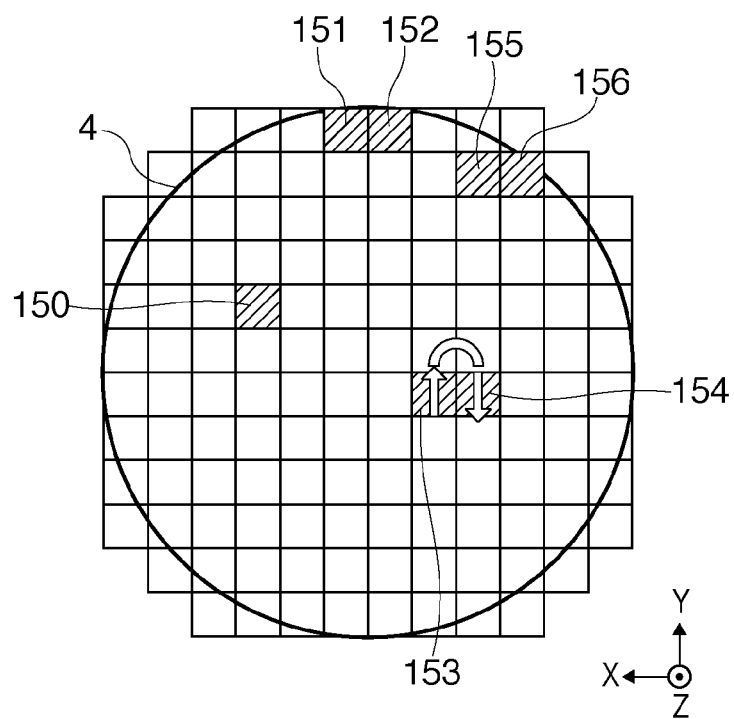
FIG. 5 is an explanatory diagram illustrating the shot layout on a wafer.
Figure 13:
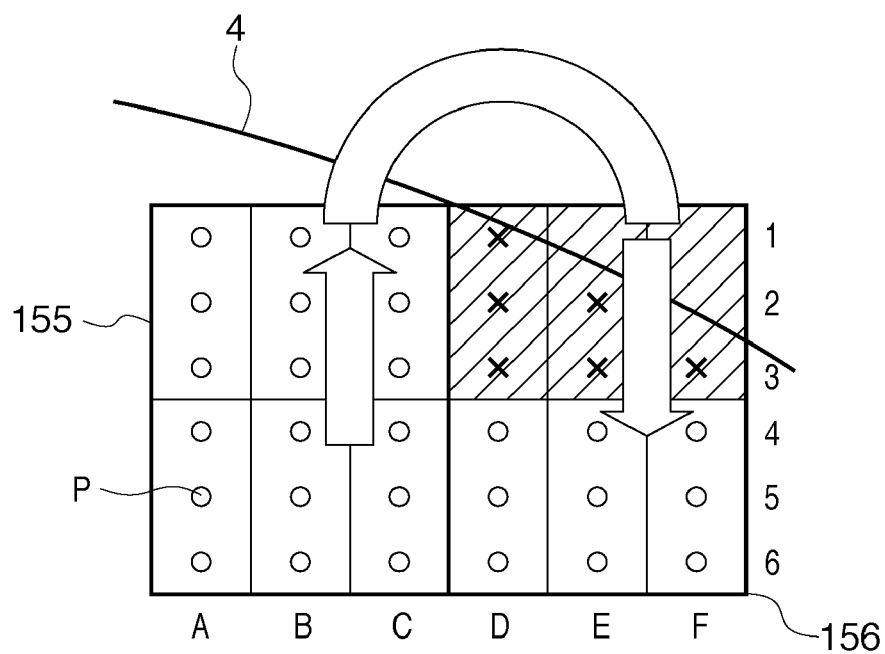
FIG. 13 is a partially enlarged diagram of the wafer shown in FIG. 5.

FIG. 13 is an enlarged diagram of shots 155 and 156 shown in FIG. 5, and assumes that 3×2=6 chips are grouped as one shot. The hatched chips are partially defected invalid chips. "x" marks in FIG. 13 indicate positions at which surface position detection is invalid on invalid chips, that is, which fall outside the shot region. The shot region is located outside the detection region. "○" marks in FIG. 13 indicate positions at which surface position detection is valid on effective chips, that is, which fall within the shot region. The shot region is located inside the detection region. The surface position detection positions are represented by columns A to F and rows 1 to 6. For example, a point P shown in FIG. 13 is expressed by (A, 5). The arrow indicates the surface position detection order. In the shot 155, the surface position is detected in the order of the 6th row to the 1st row. In the shot 156, the surface position is detected in the order of the 1st row to the 6th row.

In the shot 156, the first position, at which surface position detection is valid in the shot region, is the 4th row. During the time from when the surface position in the 1st row of the shot 155 is detected until that in the 4th row of the shot 156 is detected, the detection is not performed and, therefore, the CCD is in a dark state. For this reason, when the surface position in the 4th row of the shot 156 is detected, the detection result suffers from a shift.

In this case, the shift in the detection result can be avoided by irradiating the wafer by an illumination light source 6 at positions outside the shot region, at which surface position detection is invalid, and receiving, by the CCD, the light reflected at these positions, before surface position detection at positions at which it is valid.

That is, positions ((D, 3), (E, 3), and (F, 3)) outside the shot region, at which surface position detection is invalid, and which are each at least one position before a position at which surface position detection is valid in the shot 156, are irradiated by the illumination light source 6, and the light reflected at these positions is received by the CCD. These positions may be irradiated by the illumination light source 6, and the light reflected at these positions may be received by the CCD at the stage of surface position detection at (D, 2), (E, 2), and (D, 1).

In this manner, a photodetector 13 can be kept in a predetermined state, in which a shift in surface position detection result is avoidable by guiding the light reflected at positions outside the shot region, to become incident on the photodetector 13, and resetting the residual amount of image charge.

Third Embodiment

Figure 14:
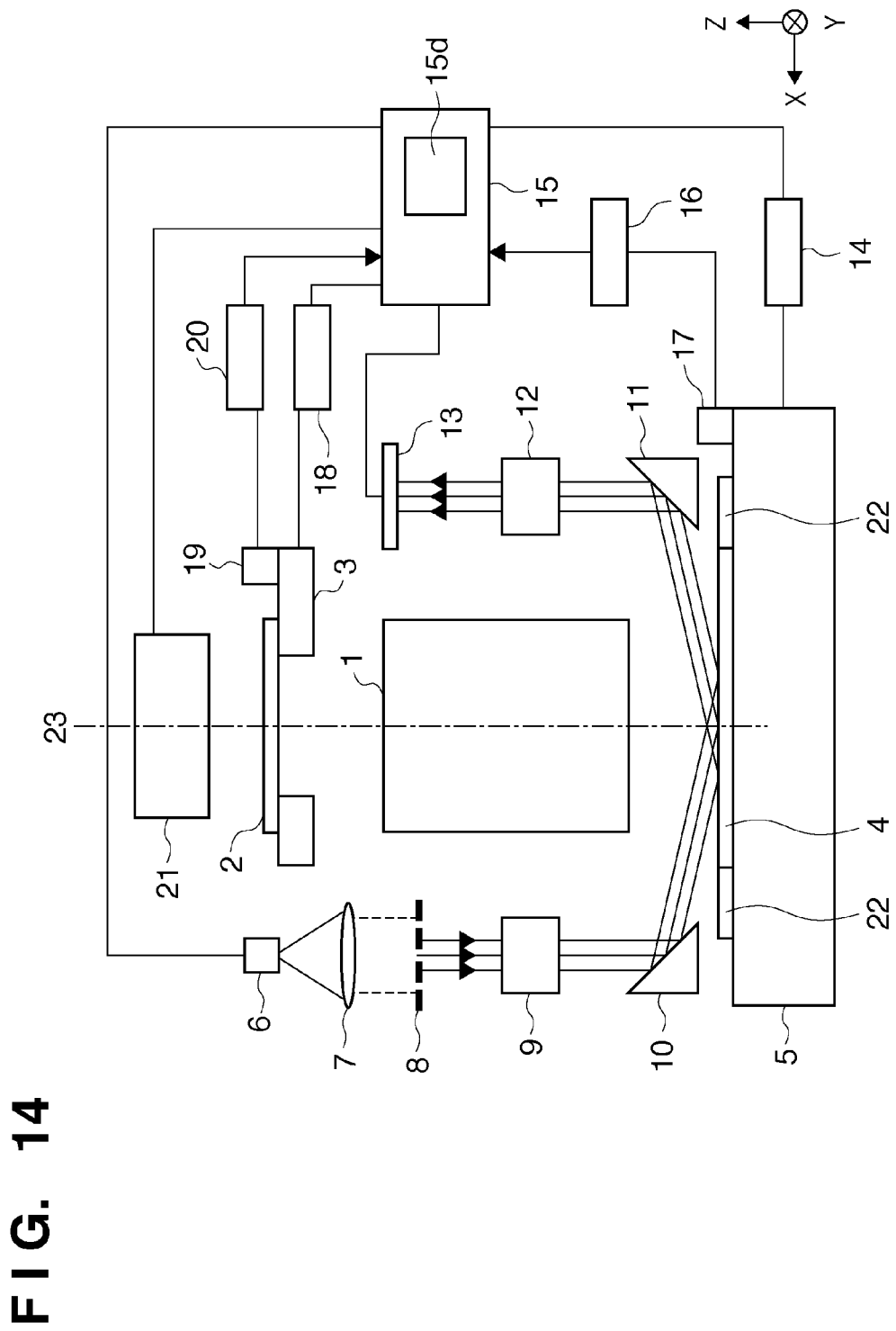
FIG. 14 is a block diagram showing the schematic arrangement of an exposure apparatus.

FIG. 14 is a schematic block diagram of a semiconductor exposure apparatus in which a reflecting plate 22, serving as a reflecting member which can be detected by a surface position detector, is arranged on the circumference of a wafer 4 on a wafer stage 5, in addition to the arrangement shown in FIG. 7. In this embodiment, to irradiate the same pixel of a CCD with light, the surface of the reflecting plate 22 is desirably, nearly flush with that of the wafer 4. Furthermore, to irradiate the reflecting plate 22 by an illumination light source 6 and to receive by the CCD the light reflected by the reflecting plate 22, the reflecting plate 22 desirably has a reflectance nearly equal to that of the wafer 4.

Figure 15:
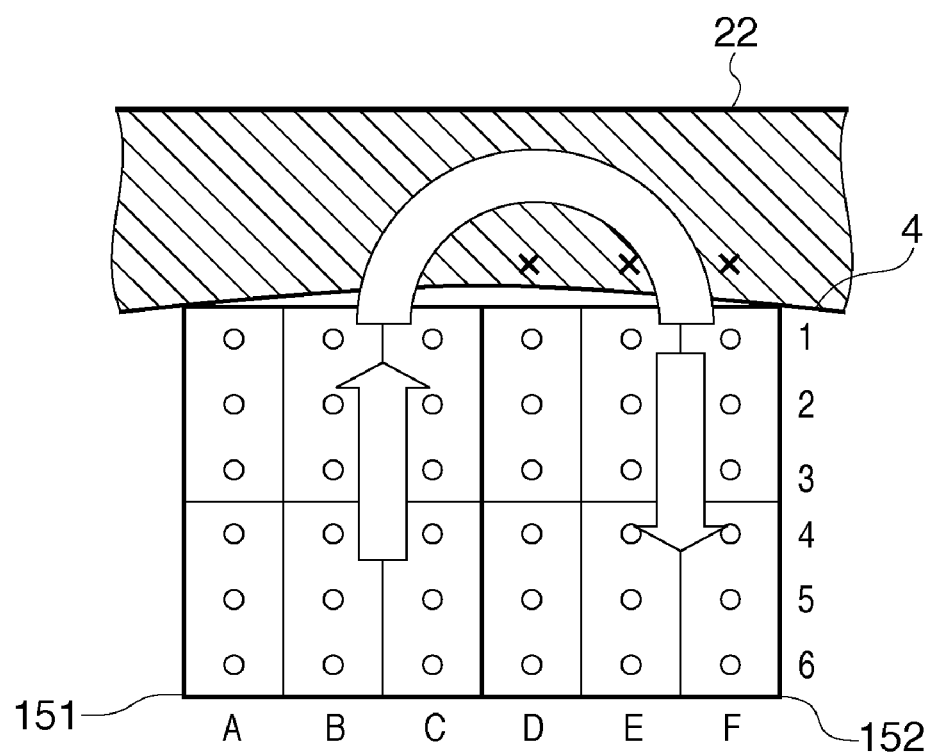
FIG. 15 is a partially enlarged diagram of the wafer shown in FIG. 5.

FIG. 15 is an enlarged view of shots 151 and 152 of the wafer 4, and assumes that 3×2=6 chips are grouped as one shot. As in FIG. 13, "○" marks indicate valid positions. The surface position detection positions are represented by columns A to F and rows 1 to 6. The arrow indicates the surface position detection order. In the shot 151, the surface position is detected in the order of the 6th row to the 1st row. In the shot 152, the surface position is detected in the order of the 1st row to the 6th row. The hatched portion indicates the reflecting plate 22 arranged around the wafer.

The first position, at which surface position detection is valid in the shot 152, is the 1st row. During the time from when the surface position in the 1st row of the shot 151 is detected until that in the 1st row of the shot 152 is detected, an untransferred charge is discharged. For this reason, when the surface position in the 1st row of the shot 152 is detected, the detection result suffers from a shift.

In this case, the shift in detection result can be avoided by receiving by the CCD light which is applied from the illumination light source 6 to the reflecting plate 22 and reflected by the reflecting plate 22, before surface position detection at positions at which it is valid.

For example, the positions indicated by the "x" marks on the reflecting plate 22, shown in FIG. 15, are irradiated by the illumination light source 6, and the light reflected at these positions is received by the CCD. Although only one "x" mark is shown for each column in the Y direction in FIG. 15, two or more "x" marks can be assumed. Furthermore, during the time from when the surface position in the 1st row of the shot 151 is detected until that in the first row of the shot 152 is detected, by irradiating the reflecting plate 22, the light reflected by the reflecting plate 22 may be continuously received by the CCD, without turning off the illumination light source 6.

Figure 1:
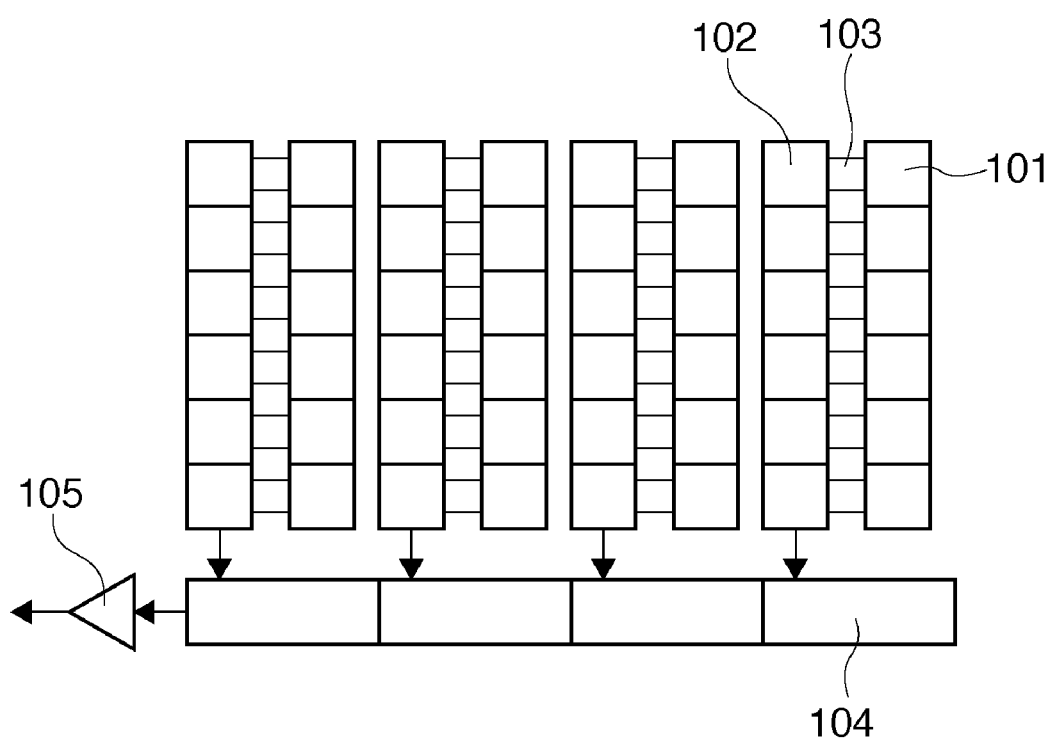
FIG. 1 is a diagram showing the schematic arrangement of a CCD.
Figure 2:
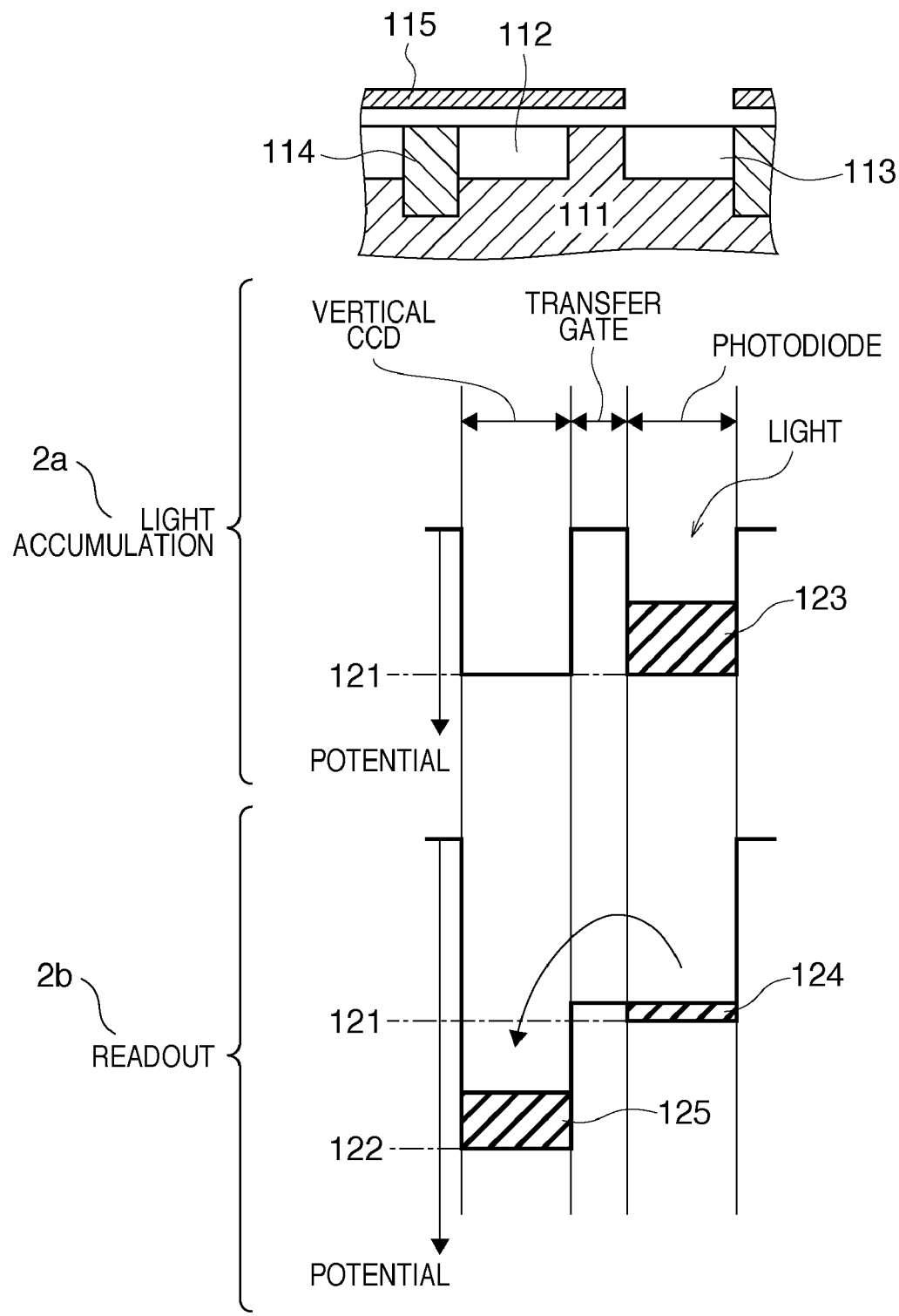
FIG. 2 shows explanatory diagrams of the schematic structure of the CCD and a residual image.
Figure 3:
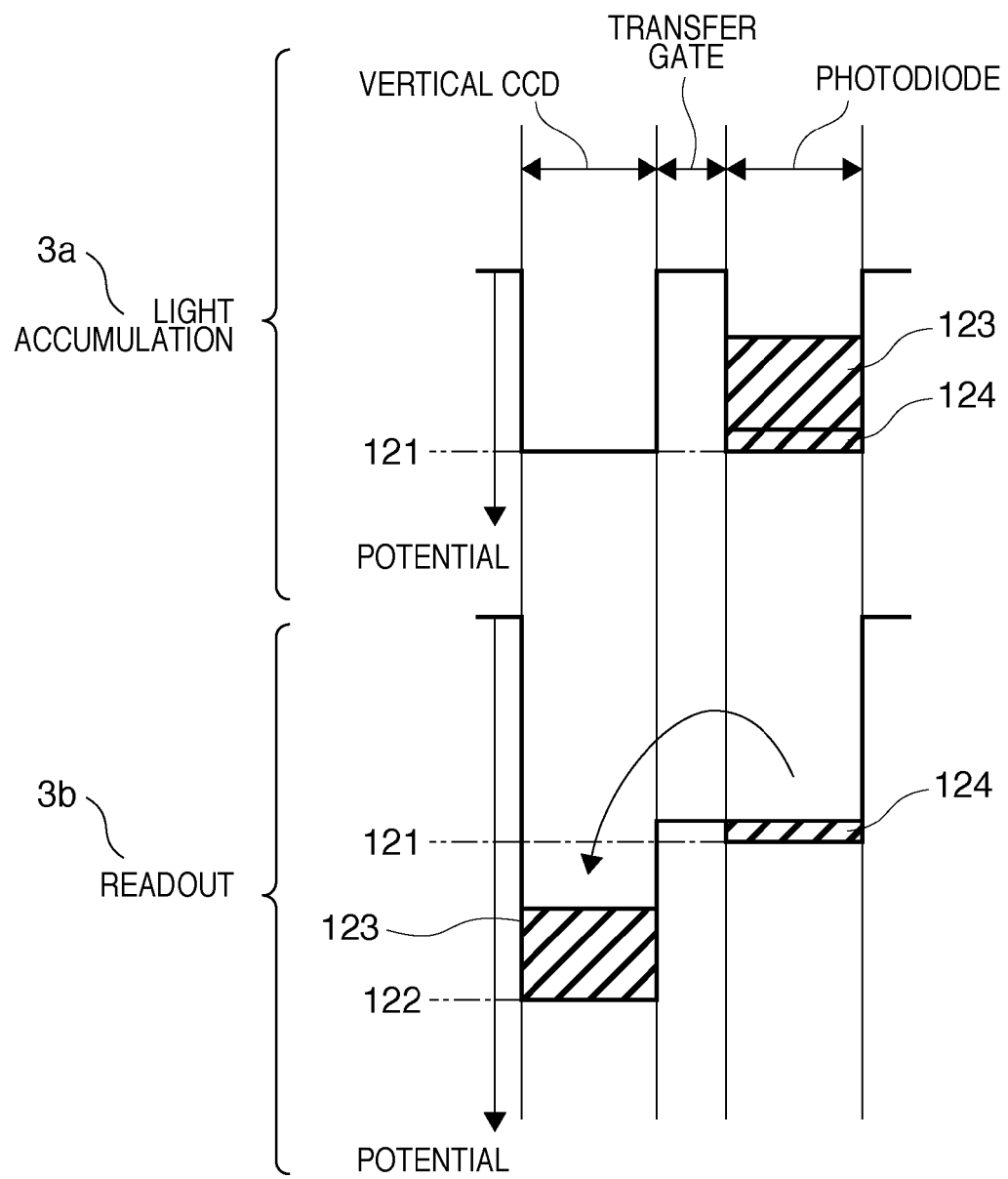
FIG. 3 is an explanatory diagram of the influence of a residual image charge.
Figure 4:
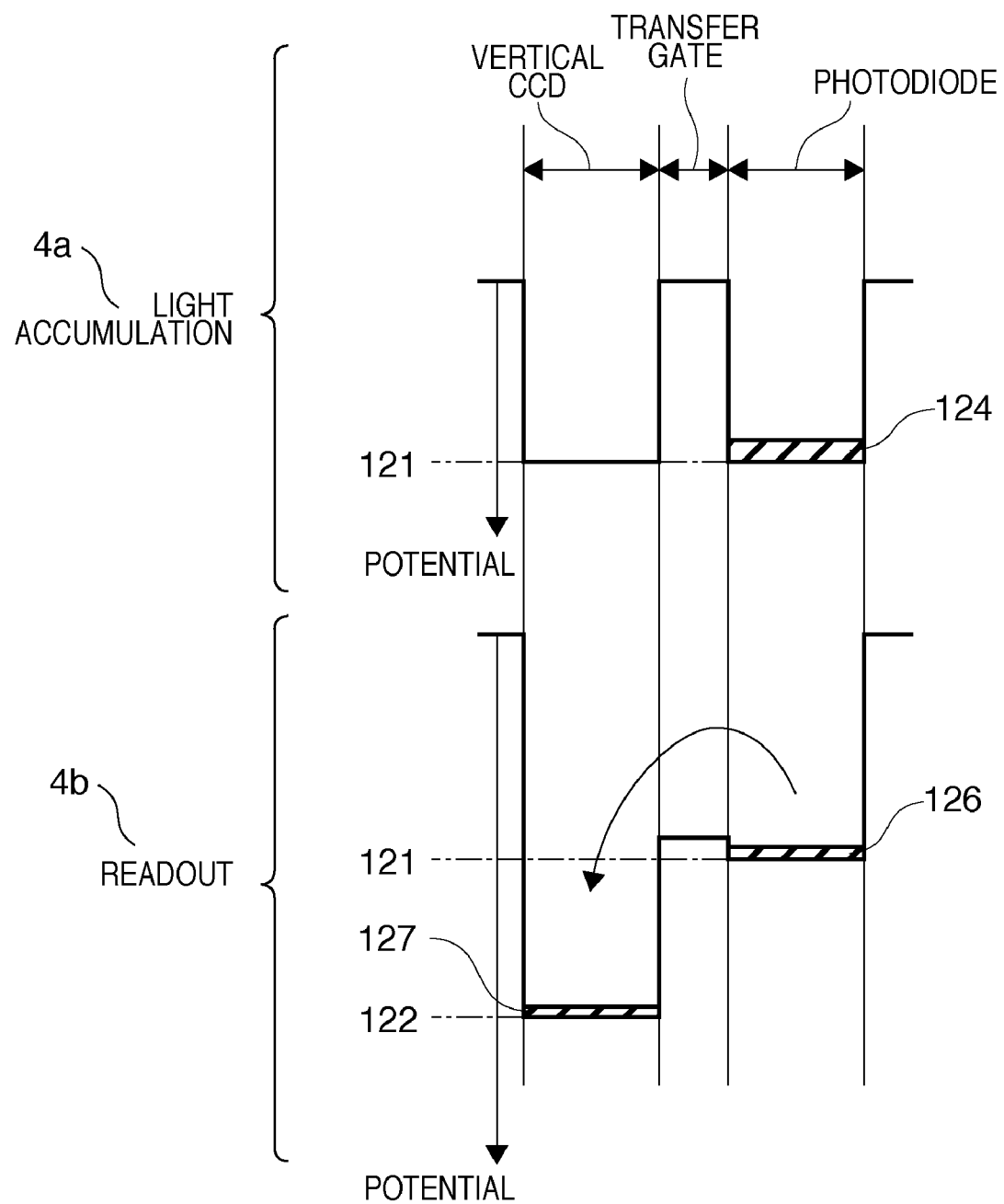
FIG. 4 is an explanatory diagram of the influence of a residual image charge.

In this manner, a shift in surface position detection result due to the influence of the untransferred charge can be avoided, by detecting the surface position in the 1st row of the shot 152, after setting the charge state of the photodiode to the state shown in FIG. 2 or 3.

Embodiment of Manufacture of a Device

An embodiment of a method of manufacturing a device using any of the above-described exposure apparatuses will be explained next.

Devices (e.g., a semiconductor integrated circuit device and liquid crystal display device) are manufactured by an exposure step of exposing a substrate to radiant energy using the exposure apparatus according to any of the above-described embodiments, a development step of developing the substrate exposed in the exposure step, and other known steps (e.g., etching, resist removal, dicing, bonding, and packaging steps) of processing the substrate developed in the development step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus that exposes a shot region on a substrate to radiant energy based on an obtained position of a surface of the shot region, the exposure apparatus comprising:

a projecting optical system configured to obliquely project detection light to a surface of a shot region on a substrate;

a receiving optical system configured to receive the detection light reflected at the shot region;

a detector including a photodetector that accumulates charges generated by the detection light incident thereon and configured to detect a position of the detection light incident on the photodetector from the receiving optical system; and a controller configured to obtain a position of the surface based on the detection by the detector, wherein the controller is configured, during a time between an end of a detection of a first shot region by the detector and a start of a detection of a second shot region by the detector, the first shot region and the second shot region being successively measured by the detector, to cause the projecting optical system to project the detection light, to cause the receiving optical system to cause the projected detection light to be incident on the detector, and to cause the photodetector to discharge the charges generated by light incident from the receiving optical system.

2. An apparatus according to claim 1, wherein the controller is configured to cause the projecting optical system to project the detection light to a surface of the substrate during the time between the end of the detection for the first shot region and the start of the detection for the second shot region.

3. An apparatus according to claim 1, further comprising a stage configured to hold the substrate and including a reflecting surface that is adjacent to the held substrate and reflects the detection light, wherein the controller is configured to cause the projecting optical system to project the detection light to the reflecting surface during the time between the end of the detection for the first shot region and the start of the detection for the second shot region.

4. A method of manufacturing a device, the method comprising:

exposing a substrate to radiant energy using an exposure apparatus defined in claim 1;

developing the exposed substrate; and processing the developed substrate to manufacture the device.

* * * * *